United States Patent
Holdsclaw (10) Patent No.: US 8,698,487 B2
(45) Date of Patent: *Apr. 15, 2014

(54) DETERMINING COMPONENTS OF AN ELECTRIC SERVICE

(75) Inventor: Scott T. Holdsclaw, Raleigh, NC (US)

(73) Assignee: Elster Solutions, LLC, Raleigh, NC (US)

( * ) Notice: Subject to any disclaimer, the term of this patent is extended or adjusted under 35 U.S.C. 154(b) by 550 days.

This patent is subject to a terminal disclaimer.

(21) Appl. No.: 12/900,651

(22) Filed: Oct. 8, 2010

(65) Prior Publication Data

US 2012/0086436 A1    Apr. 12, 2012

(51) Int. Cl.
*G01R 13/00* (2006.01)
*G01R 22/10* (2006.01)
*G01R 19/25* (2006.01)
*G01R 29/18* (2006.01)

(52) U.S. Cl.
CPC ............ *G01R 22/10* (2013.01); *G01R 19/2513* (2013.01); *G01R 29/18* (2013.01)
USPC ..................................................... 324/140 R

(58) Field of Classification Search
None
See application file for complete search history.

(56) References Cited

U.S. PATENT DOCUMENTS

| | | | |
|---|---|---|---|
| 5,544,089 A | 8/1996 | Hemminger et al. | |
| 5,631,554 A | 5/1997 | Briese et al. | |
| 6,094,622 A | 7/2000 | Hubbard et al. | |
| 6,112,158 A | 8/2000 | Bond et al. | |
| 6,236,197 B1 * | 5/2001 | Holdsclaw et al. | 324/110 |
| 6,374,188 B1 * | 4/2002 | Hubbard et al. | 702/61 |
| 6,629,046 B1 | 9/2003 | Bond et al. | |
| 2007/0262768 A1 * | 11/2007 | Holdsclaw | 324/76.58 |
| 2009/0046490 A1 * | 2/2009 | Lumsden | 363/124 |
| 2012/0089354 A1 * | 4/2012 | Holdsclaw | 702/64 |

OTHER PUBLICATIONS

U.S. Appl. No. 12/900,673, filed Oct. 8, 2010, Holdsclaw.

* cited by examiner

*Primary Examiner* — Jermele M Hollington
(74) *Attorney, Agent, or Firm* — Baker & Hostetler LLP (57) ABSTRACT

Components of an electric service may be identified by measuring voltage signals relating to the connection of an electrical energy meter connected to the electric service. The voltage signals that may be measured include line to neutral voltages and line to line voltages. The values of the measured voltage signals may be compared to reference information comprising tabulated values that may be tabulated as ratios of nominal service voltages associated with different service types.

36 Claims, 7 Drawing Sheets

| | 221 | 222 | 223 | 224 | 225 | 226 | 227 | 228 | 229 | 230 | 231 |
|---|---|---|---|---|---|---|---|---|---|---|---|
| | Service Type | Special Service Def. | Nominal Service Voltage | Van | Vbn | Vcn | Vab | Vbc | Vca | Polarity of Vbn for ABC Rotation | Polarity of Vcn for ABC Rotation |
| 291 | 4WY | | 69.3 | 100% | 100% | 100% | 173.2% | 173.2% | 173.2% | neg | pos |
| 292 | 4WD | Hi Leg C | 120 | 50% | 50% | 86.50% | 100% | 100% | 100% | N/C | neg |

DETERMINING COMPONENTS OF AN ELECTRIC SERVICE

CROSS-REFERENCE

This application is related by subject matter to U.S. patent application Ser. No. 12/900,673, filed on Oct. 8, 2010, and entitled "DETERMINING COMPONENTS OF AN ELECTRIC SERVICE USING TOLERANCE RANGES," the content of which is incorporated by reference in its entirety.

BACKGROUND

Electrical energy meters now perform tasks in addition to simple energy metering. One of the additional tasks is to verify or detect an electric service or a component of the electric service, such as a service type, a nominal service voltage and/or a phase rotation. Currently, electric service detection is typically performed, in part, by calculating one or more phase angles between applied phasor voltages.

The current systems and methods used for service detection may require complex calculations. For example, the calculations typically require using a Discrete Fourier Transform (DFT) type of calculation, where the signal in question is multiplied by a reference signal, and then multiplied by the reference signal delayed by 90 degrees. The reference signal may be an actual line to neutral voltage itself, and/or in other cases may be an ideal signal based on the reference signal. In either case, two resultant values are calculated and from those two values, an angle or angles may be calculated. The current systems and methods may also expend significant software, hardware and/or time resources to perform the calculations associated with determining the phase angle, and further, to determine service components from the applied voltage phasors and phase angles. Examples of current systems and methods to determine an electric service may be found in U.S. Pat. No. 6,094,622 entitled SYSTEM AND METHOD FOR AUTOMATICALLY DETERMINING THE ELECTRICAL ENERGY SERVICE TYPE TO WHICH AN ENERGY METER IS CONNECTED, U.S. Pat. No. 6,112,158 entitled SERVICE TYPE RECOGNITION IN ELECTRICAL UTILITY METER and U.S. Pat. No. 5,631,554 entitled ELECTRONIC METERING DEVICE INCLUDING AUTOMATIC SERVICE SENSING.

It would be desirable to be able to identify alternate ways to determine an electric service, or a component of the electric service, associated with an electrical energy meter connection without directly calculating a phase angle.

SUMMARY

In an electrical system, an electrical energy meter may determine components of an electric service relating to a connection of the electrical energy meter. Components of the electric service may include a service type (which may include a special service definition), nominal service voltage and/or phase rotation.

Voltage signals relating to the connection of the electrical energy meter may be measured. The voltage signals that may be measured include line to neutral voltages and line to line voltages. The measurements may be taken as RMS values. The values of the measured voltage signals may be compared to reference information, such as a service record. The reference information may comprise tabulated values. The tabulated values may be tabulated as ratios of nominal service voltages associated with different service types. The comparison may be made in order to determine a service type and nominal service voltage associated with the connection of the electrical energy meter by matching the measured values with tabulated values.

An allowable tolerance range may be used when comparing a measured voltage value to a value determined from the tabulated ratios. If the measured voltage value is within the allowable tolerance range of a value from the tabulated ratios, the measured voltage may be deemed to satisfy the tabulated value.

A zero crossing of a line to neutral voltage may be detected. One or more additional line to neutral voltages may be measured at approximately the time of the zero crossing. A polarity of each of the one or more additional line to neutral voltages may be determined from the measurements. A relationship between the zero crossing of the line to neutral voltage and the determined polarity of each of the one or more additional line to neutral voltages may be compared to tabulated phase rotation relationships for different service types in order to determine a phase rotation relating to the connection of the electrical energy meter.

Multiple measurements may be taken of each of the one or more additional line to neutral voltages. A polarity may be determined for each measurement. Further, a polarity may be determined for each of the one or more additional line to neutral voltages by determining a majority of the polarities relating to the multiple measurements for a respective additional line to neutral voltage. The determined majority indicates the polarity of the respective additional line to neutral voltage.

DETAILED DESCRIPTION

Most electrical energy meters digitally sample voltage and current signals on one to three different phases, and process them to typically generate quantities for billing purposes. Electrical energy meters typically measure basic power quantities like watthours, VARhours or VAhours. The electronic electrical energy meters also have become capable of conducting a variety of instrumentation and/or power line performance determinations.

Systems and methods describing the novel techniques will now be described with reference to the figures. It will be appreciated by those of ordinary skill in the art that the description given herein with respect to those figures is for exemplary purposes only and is not intended in any way to limit the scope of the invention. For example, although an example electrical energy meter may be used to illustrate the invention, it should be appreciated that this electrical energy meter is merely provided for the purpose of clearly describing the methods and systems. However, this discussion is not intended to limit the disclosed embodiments. In fact, the disclosed techniques are equally applicable to other meters and metering systems.

Figure 1:
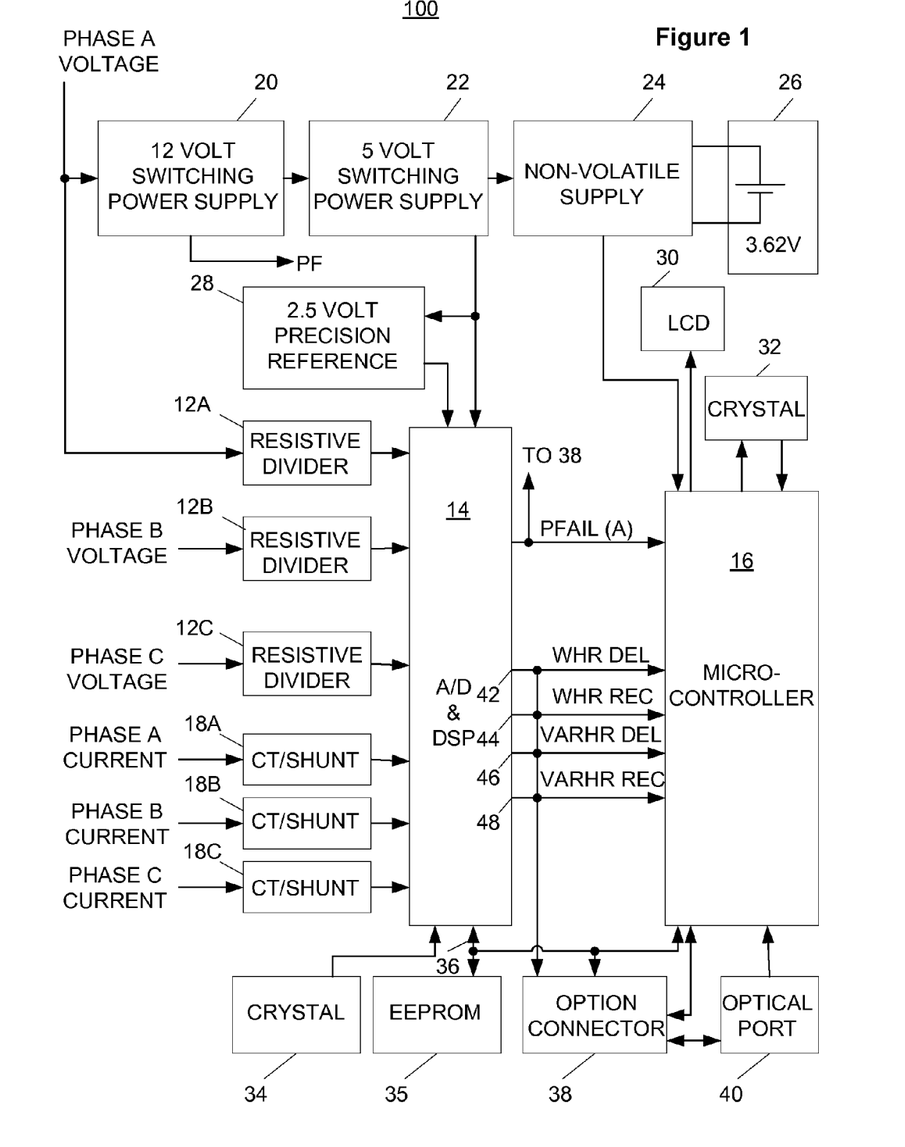
FIG. 1 is a block diagram of a programmable electrical energy meter for measuring electrical parameters.

FIG. 1 is a block diagram showing the functional components of an example electrical energy meter and related interfaces to which the present invention is applicable. As shown in FIG. 1, an electrical energy meter 100 for metering three-phase electrical energy preferably includes a digital LCD type display 30, crystal oscillators 32 and 34, a meter integrated circuit (IC) 14 which preferably comprises A/D converters and a programmable digital signal processor (DSP), and a microcontroller 16. The meter also includes a 12 V switching power supply 20 that is capable of receiving alternating current voltage, a 5 Volts switching power supply 22, a non-volatile power supply 24 that switches to a battery 26 when 5 Volts supply is inoperative, and a 2.5 Volt precision voltage reference 28. Analog voltage and current signals propagating over power distribution lines between the power generator of the electric service provider and the users of the electrical energy are sensed by voltage dividers 12A, 12B, 12C and current transformers or shunts 18A, 18B, 18C, respectively.

The outputs of the resistive dividers 12A-12C and current transformers 18A-18C, or sensed voltage and current signals, are provided as inputs to the meter IC 14. The A/D converters in the meter IC 14 convert the sensed voltage and current signals into digital representations of the analog voltage and current signals. In a preferred embodiment, the A/D conversion is carried out as described in U.S. Pat. No. 5,544,089, dated Aug. 6, 1996, and entitled PROGRAMMABLE ELECTRICAL METER USING MULTIPLEXED ANALOG-TO-DIGITAL CONVERTERS, which is herein incorporated by reference. The digital voltage and current signals are then input to the programmable DSP in the meter IC 14 for generating pulsed signals 42, 44, 46, 48 representing various power measurements, i.e., each pulse represents the Ke value associated with Watts, VAs, or VARs. These pulsed signals may be processed by the microcontroller 16 to perform revenue metering functions for billing purposes.

The microcontroller 16 preferably interfaces with the meter IC 14 and with one or more memory devices through an IIC bus 36. A memory, preferably a non-volatile memory such as an EEPROM 35, is provided to store nominal phase voltage and current data and threshold data as well as programs and program data. Upon power up after installation, a power failure, or a data altering communication, for example, selected data stored in the EEPROM 35 may be downloaded to the program RAM and data RAM associated within the meter IC 14, as shown in FIG. 1. The DSP under the control of the microcontroller 16 processes the digital voltage and current signals in accordance with the downloaded programs and data stored in the respective program RAM and data RAM.

To perform line frequency measurements and compensation, the meter IC 14 monitors the line frequency over, for example, multiple line cycles. It should be understood that the number of line cycles is preferably programmable and a different number of line cycles may be used for designated measurements. In fact, using the disclosed techniques it may be possible to perform power line measurements and analysis using less than one full line cycle.

Following power-up at installation, a service test may be performed to identify and/or check the electric service and/or determine the electric service, or components thereof, (e.g., using the methods described herein.). The electrical energy meter may be preprogrammed for use with a designated service or it may determine the service using a service test. When the service test is used to identify the electric service, an initial determination is made of the number of active elements. To this end, each element (i.e., 1, 2, or 3 elements) may be checked for voltage. Once the number of elements is identified, many of the service types can be eliminated from the list of possible service types. The service voltage may be determined by comparing the RMS voltage measurements for each phase with nominal phase voltages for the identified service. If the nominal service voltages for the identified service matches measured values within an acceptable tolerance range, a valid service is identified. The phase rotation relative to phase A (or any other phase) may then be determined by finding polarity of the line under test with respect to the reference phase A, for example. The phase rotation, nominal service voltage, and service type may be displayed on the LCD display 30. The service may be locked, i.e., the service information is stored in a memory, preferably a non-volatile memory, such as the EEPROM 35, manually or automatically. There are a variety of possible service types including 4-wire wye, 3-wire wye, 4-wire delta, 3-wire delta, or single phase, just to name a few.

When the service type is known in advance and locked, the service test may check to ensure that each element is receiving line potential, and the line to neutral and line to line voltages are within a predetermined percentage of the nominal service voltage. The line to neutral voltages may also be sampled to determine polarity of a voltage, and eventually phase rotation of the service. If the voltages are within the specified ranges, the nominal service voltage, the service type and the phase rotation may be displayed on the electrical energy meter display. If either a valid service is not found or the service test for a designated service fails, a system error code indicating an invalid service may be displayed and locked on the display to ensure that the failure is noted and evaluated to correct the error.

It should also be appreciated that electrical energy meter 100 also provides for remote meter reading, remote power quality monitoring, and reprogramming through an optical port 40 and/or an option connector 38. Although optical communications may be used in connection with the optical port 40, option connector 38 may be adapted for RF communications or electronic communications via modem, for example.

The disclosed techniques may be in firmware, wherein such operations are enabled by the correct programming of data tables. However, it should also be appreciated that the disclosed techniques also may be using software and/or hardware, or in a combination of the two. In fact, the disclosed techniques are not limited to any particular implementation but contemplate implementation in any tangible form.

There are a variety of different electrical energy meter types that are used to meter electrical energy, including 3-Element, 2-Element, 2½-Element, and 1-Element meters. Moreover, there are a variety of different electric service types on which electrical energy meters may be installed, including 3-phase 4-wire Wye, 3-phase 4-wire Delta, 3-phase 3-wire Delta, network, dual single phase, 2-wire and 3-wire single phase, and "single phase test."

Each of the various different electrical energy meter types may be capable of metering more than one of the various different service types. For example, a 3-Phase 4-Wire Wye ("4WY") service may include three voltages with respect to neutral and three line currents, one current for each voltage phase. When metering the 4WY service using a 3-Element electrical energy meter, each line current may be multiplied by its associated line to neutral voltage. Metering the 4WY service with a 2½-Element electrical energy meter may use two voltages, e.g., Phase A to neutral and Phase C to neutral, and 3 line currents. Line currents for Phase A and Phase C may be multiplied by their respective line to neutral voltages, and the Phase B current may be multiplied by the negated sum of the Phase A and Phase C voltages (which may approximate the Phase B line to neutral voltage in a balanced system). Metering the 4WY service with a 2-Element meter may use external current transformers to combine the currents such that the Phase A line to neutral voltage is multiplied by a current representing the Phase A line current minus the Phase B line current. Phase C line to neutral voltage may be multiplied by a current representing the Phase C line current minus the Phase B line current.

A 3-Phase 4-Wire Delta ("4WD") service may include three voltages with respect to a ground point that is placed at the center-tapped point between two of the three voltages (e.g., typically between Phases A and B). Metering the 4WD service may use two or three currents depending on the type of electrical energy meter used. When metering the 4WD service with a 3-Element electrical energy meter, each line current may be multiplied by its associated line to ground voltage. Metering the 4WD service with a 2-Element electrical energy meter may use two voltages, e.g., Phase C to ground and the voltage from Phase A to Phase B. The two currents available to the 2-Element electrical energy meter may be the Phase C line current and the Phase A current minus Phase B current. Operation of the 2-Element electrical energy meter may conserve the equipment costs required by an additional voltage transformer and/or an additional current transformer.

As another example, a 3-Phase 3-Wire Delta (3WD) service may include two voltages with respect to a third voltage, generating actual line-to-line voltages, and 2 currents, which may be measured with a 2-Element electrical energy meter. However, a 3-Element meter may also be used, e.g., with neither voltage nor current applied to one of the 3 phases (e.g., Phase B may be left open).

Also, there is a Dual Single Phase (Dual 1P) service. The Dual 1P service may have five voltage points. There may be two 3-wire single phase services 90 degrees apart having their center-taps tied together and grounded. This service typically may be measured by a 2-Element electrical energy meter. However, because the 2-Element electrical energy meter may have four voltage input points, the four voltages may be applied to the electrical energy meter and the common grounded center-tap may not be provided to the electrical energy meter. For the current, two of the currents may be combined for one of the 3-wire services and applied to the appropriate current input. The two other currents for the other 3-wire service may be combined and applied to the other current input on the electrical energy meter.

Single phase electrical energy meters may be associated with 2-wire or S-wire services. A 2-wire single phase service may have a single line to ground voltage and a single line current. A single phase service may be metered with a single phase meter, however a 2-Element or 3-Element meter may be used, e.g., by using one of the available phases (typically Phase A).

A single phase 3-wire service may be a 2-phase service with the two voltages to ground being 180 degrees away from each other. This may represent the typical residential service type. This service may be metered by a single phase meter where two "line voltages" may be supplied to the meter with no ground connection. Both current legs (from the two line voltages) may also be supplied to the meter. The single phase meter may calculate a line to line voltage and multiply that by the average of the current from the two currents that are input. A 2-phase service may be metered with a 2-Element meter in which both line voltages and the ground voltage may be supplied to the meter. Both current legs (from the two line voltages) may be supplied to the meter. In the 2-Element meter each line to ground voltage may be multiplied by its respective current.

The single phase test service (1P Test) may represent a convenience for utilities to recognize a commonly used testing configuration where the same single voltage may be applied to the phases of a meter. This may be done on any of the different meter types.

Figure 2:
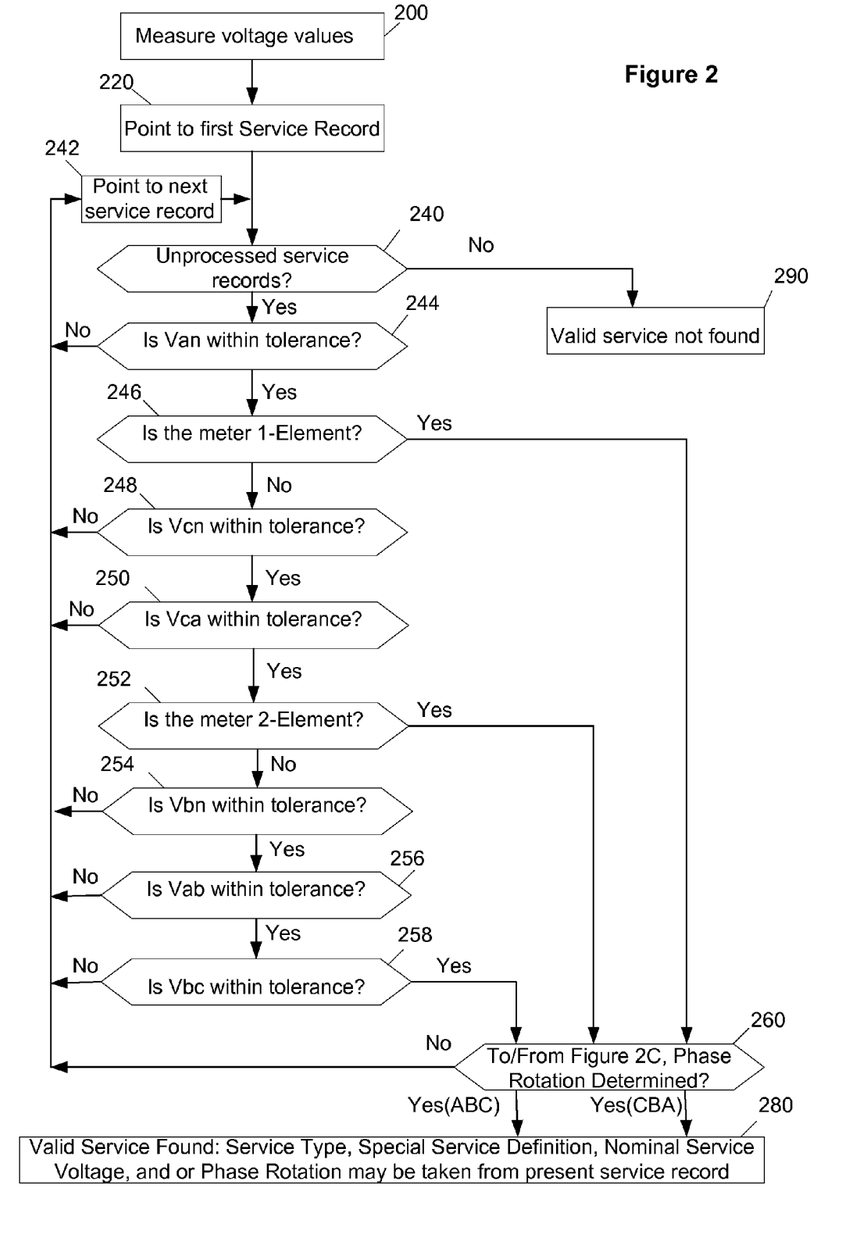
FIG. 2 illustrates an exemplary method to determine components of an electric service, such as a service type and/or a nominal service voltage, relating to a connection of an electrical energy meter.

FIG. 2 illustrates an exemplary method to determine components of an electric service, such as a service type, special service definition and/or nominal service voltage, relating to a connection of an electrical energy meter. The method illustrated in FIG. 2, as well as other methods herein disclosed, may refer to one or more service record tables that list reference information relating to known services.

Figure 2A:
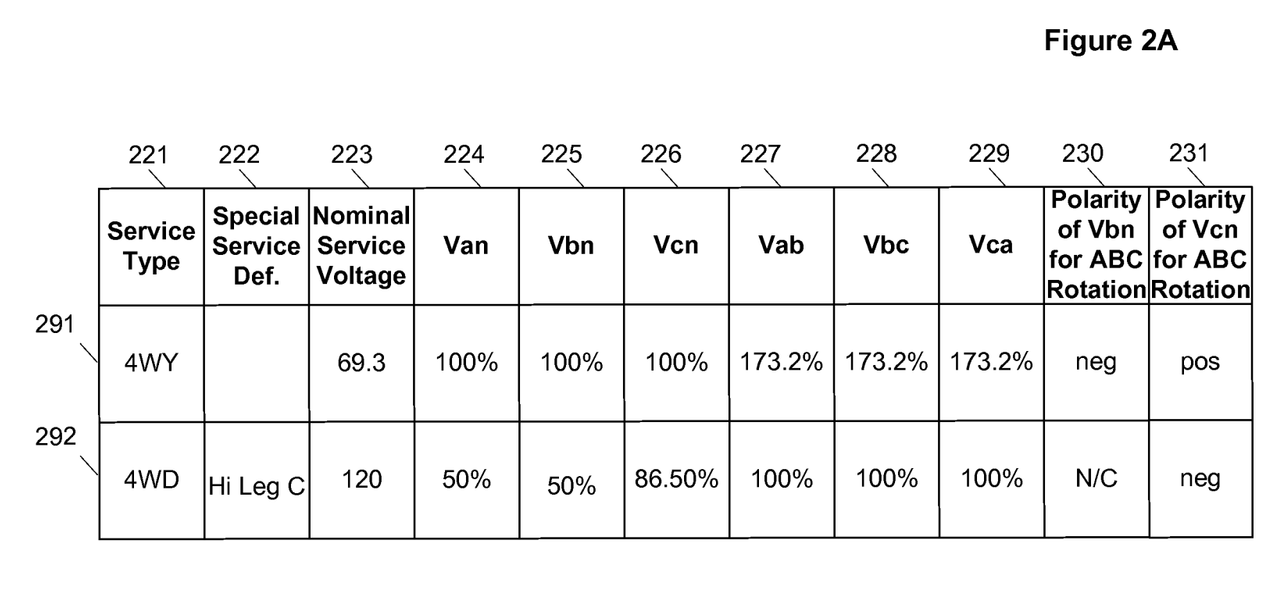
FIG. 2A is a diagram illustrating a partial service record table for a 3-Element electrical energy meter.

An exemplary service record table is shown in FIG. 2A illustrating partial data for a 3-Element electrical energy meter. The partial service record table of FIG. 2A illustrates several columns and rows, including column 221, column 222, column 223, column 224, column 225, column 226, column 227, column 228, column 229, column 230 and column 231, as well as row 291 and row 292. A row in a service record table, e.g., row 291 or 292 in FIG. 2A, may be referred to a service record or record.

Column 221 lists some service types to which an electrical energy meter may be connected. For example, possible service types include a 3-Phase Four Wire Wye ("4WY") service type as illustrated in row 291 and a 3-Phase Four Wire Delta ("4WD") service type, as illustrated in row 292. Column 222 may list some special service definitions. A special service definition may serve to differentiate between entries with the same service type, as illustrated in row 292 where "Hi Leg C" is a special service definition for a 3-Phase Four Wire Delta ("4WD") service type. The term "service type" may refer to the combination of "service type" (column 221) and "special service definition" (column 222). Column 223 lists some nominal service voltages to which an electrical energy meter may be connected. For example, a possible nominal service voltage value for the 3-Phase Four Wire Wye ("4WY") service type as illustrated in row 291 may be 69.3 Volts. As another example, a possible nominal service voltage value for the 3-Phase Four Wire Delta ("4WD") service type as illustrated in row 292 may be 120 Volts.

Columns 224-229 list known voltage ratios/values (i.e., the percentage of the nominal service voltage associated with each line to neutral and/or line to line voltage) associated with a given service. Column 224 lists line to neutral voltage ratios/values for a voltage measured from line A to neutral, Van, relating to different service types. Column 225 lists line to neutral voltage ratios/values for a voltage measured from line B to neutral, Vbn, relating to different service types. Column 226 lists line to neutral voltage ratios/values for a voltage measured from line C to neutral, Vcn, relating to different service types. Column 227 lists line to line voltage ratios/values for a voltage measured from line A to line B, Vab, relating to different service types. Column 228 lists line to line voltage ratios/values for a voltage measured from line B to line C, Vbc, relating to different service types. Column 229 lists line to line voltage ratios/values for a voltage measured from line C to line A, Vca, relating to different service types.

The line to neutral and line to line voltages are listed as ratios/values of a related nominal service voltage. That is, each service type may indicate a relationship between each of these voltages and a nominal service voltage. Thus, the listed ratios (i.e., percentages) indicate an expected voltage value for its related line to neutral or line to line voltage. For example, for the 3-Phase Four Wire Wye ("4WY") service type listed in row 291, the line to line voltages Van, Vbn and Vcn may be 100.0% of the nominal service voltage of 69.3 Volts. That is, for a 4WY service type and a nominal service voltage of 69.3 Volts, the expected line to neutral voltages are:

Van=69.3 Volts
Vbn=69.3 Volts; and
Vcn=69.3 Volts

The line to line voltages Vab, Vbc and Vca may be 173.2% of the nominal service voltage of 69.3 Volts. That is, for a 4WY service type and a nominal service voltage of 69.3 Volts, the expected line to line voltages are:

Vab=120.0 Volts
Vbc=120.0 Volts; and
Vca=120.0 Volts

Columns 230 and 231 list expected polarities of the Vbn and Vcn signals respectively for an ABC phase rotation. The designation "neg" may refer to the polarity of a given signal being negative at the time of a positive Phase A (Van) voltage zero crossing. The designation "pos" may refer to the polarity of a given signal being positive at the time of a positive Phase A voltage zero crossing. "N/C" may indicate that the polarity of the signal may not be used to detect or validate the phase rotation.

Tables 1, 2, 3, and 4 illustrate more detailed reference information for several different meter types and services. Table 1 illustrates service records for a 3-Element electrical energy meter for known service types and nominal service voltages. Table 2 illustrates service records for a 2½-Element electrical energy meter for known service types and nominal service voltages. Table 3 illustrates service records for a 2-Element electrical energy meter for known service types and nominal service voltages. Table 4 illustrates service records for a 1-Element electrical energy meter for known service types and nominal service voltages. The voltage values in the tables (i.e., the nominal service voltages, line to neutral voltages and line to line voltages) may be given as root mean square (RMS) values. Service types may be associated with different nominal service voltages. For example in Table 1, the nominal service voltage values for a 3-Element Four Wire Wye ("4WY") service type are 69.3, 120 or 277 Volts, and for a 3-Element Four Wire Delta ("4WD") service type are 120, 240 or 480 Volts.

TABLE 1

Exemplary Service Record Table for a 3-Element Meter

| Service Type | Special Service Definition | Nom Svc Voltage | Van | Vbn | Vcn | Vab | Vbc | Vca | Polarity of Vbn for ABC rotaion | Polarity of Vcn for ABC rotaion |
|---|---|---|---|---|---|---|---|---|---|---|
| 4WY | | 69.3 | 100.0% | 100.0% | 100.0% | 173.2% | 173.2% | 173.2% | neg | pos |
| 4WY | | 120 | 100.0% | 100.0% | 100.0% | 173.2% | 173.2% | 173.2% | neg | pos |
| 4WY | | 277 | 100.0% | 100.0% | 100.0% | 173.2% | 173.2% | 173.2% | neg | pos |
| 4WD | Hi Leg C | 120 | 50.0% | 50.0% | 86.6% | 100.0% | 100.0% | 100.0% | N/C | pos |
| 4WD | Hi Leg C | 240 | 50.0% | 50.0% | 86.0% | 100.0% | 100.0% | 100.0% | N/C | pos |
| 4WD | Hi Leg C | 480 | 50.0% | 50.0% | 86.6% | 100.0% | 100.0% | 100.0% | N/C | pos |
| 4WD | Hi Leg B | 120 | 50.0% | 86.6% | 50.0% | 100.0% | 100.0% | 100.0% | neg | N/C |
| 4WD | Hi Leg B | 240 | 50.0% | 86.6% | 50.0% | 100.0% | 100.0% | 100.0% | neg | N/C |
| 4WD | Hi Leg B | 480 | 50.0% | 86.6% | 50.0% | 100.0% | 100.0% | 100.0% | neg | N/C |
| 4WD | Hi Leg A | 120 | 86.6% | 50.0% | 50.0% | 100.0% | 100.0% | 100.0% | neg | pos |
| 4WD | Hi Leg A | 240 | 86.6% | 50.0% | 50.0% | 100.0% | 100.0% | 100.0% | neg | pos |
| 4WD | Hi Leg A | 480 | 86.6% | 50.0% | 50.0% | 100.0% | 100.0% | 100.0% | neg | pos |
| 1P_test | | 120 | 100.0% | 100.0% | 100.0% | 0.0% | 0.0% | 0.0% | N/C | N/C |
| 1P_test | | 240 | 100.0% | 100.0% | 100.0% | 0.0% | 0.0% | 0.0% | N/C | N/C |
| 1P_test | | 277 | 100.0% | 100.0% | 100.0% | 0.0% | 0.0% | 0.0% | N/C | N/C |
| 1P_test | | 480 | 100.0% | 100.0% | 100.0% | 0.0% | 0.0% | 0.0% | N/C | N/C |

TABLE 2

Exemplary Service Record Table for 2½-Element Meter

| Service Type | Special Service Definition | Nom Svc Voltage | Van | Vbn | Vcn | Vab | Vbc | Vca | Polarity of Vbn for ABC rotaion | Polarity of Vcn for ABC rotaion |
|---|---|---|---|---|---|---|---|---|---|---|
| 4WY | | 69.3 | 100.0% | 100.0% | 100.0% | 173.2% | 173.2% | 173.2% | Neg | Pos |
| 4WY | | 120 | 100.0% | 100.0% | 100.0% | 173.2% | 173.2% | 173.2% | Neg | Pos |
| 4WY | | 277 | 100.0% | 100.0% | 100.0% | 0.0% | 0.0% | 0.0% | Neg | Pos |

TABLE 2-continued

Exemplary Service Record Table for 2½-Element Meter

| Service Type | Special Service Definition | Nom Svc Voltage | Van | Vbn | Vcn | Vab | Vbc | Vca | Polarity of Vbn for ABC rotaion | Polarity of Vcn for ABC rotaion |
|---|---|---|---|---|---|---|---|---|---|---|
| 1P_test | | 69.3 | 100.0% | 200.0% | 100.0% | 0.0% | 0.0% | 0.0% | N/C | N/C |
| | | 120 | 100.0% | 200.0% | 100.0% | 300.0% | 300.0% | 0.0% | N/C | N/C |
| | | 277 | 100.0% | 200.0% | 100.0% | 300.0% | 300.0% | 0.0% | N/C | N/C |

TABLE 3

Exemplary Service Record Table for 2-Element Meter

| Service Type | Special Service Definition | Nom Svc Voltage | Van | Vbn | Vcn | Vab | Vbc | Vca | Polarity of Vbn for ABC rotaion | Polarity of Vcn for ABC rotaion |
|---|---|---|---|---|---|---|---|---|---|---|
| 3WY | | 69.3 | 100.0% | | 100.0% | | | 173.2% | | Pos |
| 3WY | | 120 | 100.0% | | 100.0.0% | | | 173.2% | | Neg |
| 3WY | | 277 | 100.0% | | 100.0.0% | | | 173.2% | | Pos |
| 3WD | | 120 | 100.0% | | 100.0% | | | 100.0% | | Pos |
| 3WD | | 240 | 100.0% | | 100.0% | | | 100.0% | | Pos |
| 3WD | | 480 | 100.0% | | 100.0% | | | 100.0% | | Pos |
| 4WD | Hi Leg C | 120 | 100.0% | | 86.6% | | | 132.3% | | Pos |
| 4WD | Hi Leg C | 240 | 100.0% | | 86.6% | | | 132.3% | | Pos |
| 4WD | Hi Leg C | 480 | 100.0% | | 86.6% | | | 132.3% | | Pos |
| 3W 1P | | 120 | 50.0% | | 50.0% | | | 0.0% | | N/C |
| 3W 1P | | 120 | 50.0% | | 50.0% | | | 0.0% | | N/C |
| 3W 1P | | 240 | 50.0% | | 50.0% | | | 0.0% | | N/C |
| 3W 1P | | 480 | 50.0% | | 50.0% | | | 0.0% | | N/C |
| 1P_test | | 69.3 | 100.0% | | 100.0% | | | 0.0% | | N/C |
| 1P_test | | 120 | 100.0% | | 100.0% | | | 0.0% | | N/C |
| 1P_test | | 240 | 100.0% | | 100.0% | | | 0.0% | | N/C |

TABLE 4

Exemplary Service Record Table for 1-Element Meter

| Service Type | Special Service Definition | Nom Svc Voltage | Van | Vbn | Vcn | Vab | Vbc | Vca | Polarity of Vbn for ABC rotaion | Polarity of Vcn for ABC rotaion |
|---|---|---|---|---|---|---|---|---|---|---|
| 1P_test | | 120 | 100.0% | | | | | | | |
| 1P_test | | 240 | 100.0% | | | | | | | |
| 1P_test | | 480 | 100.0% | | | | | | | |

Referring back to FIG. 2, at 200, measurements may be taken. For example, voltage and/or polarity measurements, such as those listed in Tables 1-4 may be taken. As described in detail below, the measurements may be saved and compared to tabulated values, such as those in Tables 1-4, in order to determine one or more electric service components. Measurements may be made contemporaneously with the comparisons illustrated within FIG. 2, which may be an alternative, or in addition to, the measurements at 200.

Figure 2B:
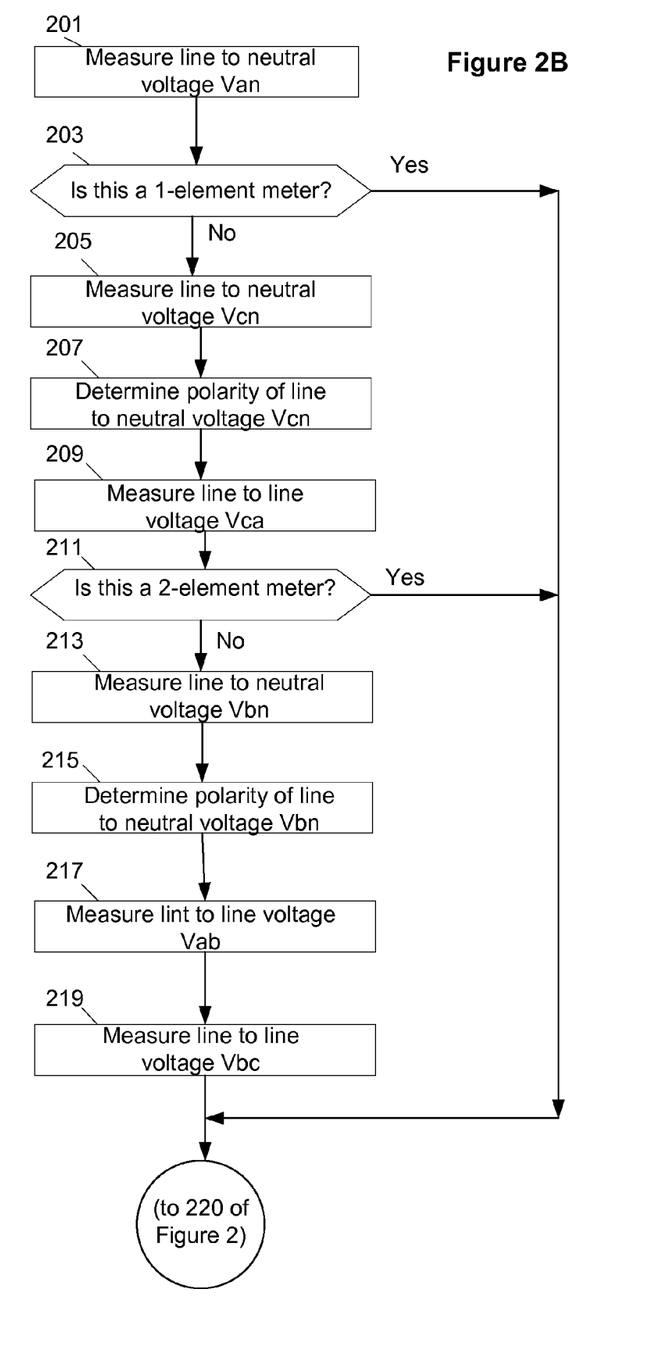
FIG. 2B illustrates an exemplary method to determine voltage measurements that may be made for different meter types.

FIG. 2B illustrates exemplary functions that may be related to the measurements at 200. At 201, line to neutral voltage Van may be measured. At 203, a determination may be made whether the meter is a 1-element meter. If the meter is a 1-element meter, the method may continue at 220 of FIG. 2. If the meter type is not a 1-element meter, line to neutral voltage Vcn may be measured at 205. At 207, the polarity of Vcn may be determined at a positive zero crossing of Van. At 209, the line to line voltage Vca may be measured. At 211 a determination may be made whether the meter is a 2-element meter. If the meter is a 2-element meter, the method may continue at 220 of FIG. 2. If the meter type is not a 2-element meter, at 213, line to neutral voltage Vbn may be measured. At 215, the polarity of Vbn may be determined at a positive zero crossing of Van. At 217 the line to line voltage Vab may be measured and, at 219, line to line voltage Vbc may be measured. The method may continue at 220 of FIG. 2, which may point to a first service record.

At 220, a particular service record may be identified. The particular service record may be used as a starting point for service record comparisons. For example, a first service record of a first service record table may be identified.

At 240, a determination may be made whether there are unprocessed service records (e.g., from one or more service record tables). As an example, if entry to 240 comes from 220 then the service record identified at 220 may be used in subsequent comparisons. If entry to 240 comes from 242, a different service record, if an unprocessed service record is available, may be used, e.g., the subsequent record following the last one used. If an unprocessed service record is unavailable, the process may continue at 290, which may indicate that a valid service was not found.

If, at 240, an unprocessed service record is available, the method may continue at 244. At 244, a determination may be made whether the measured voltage Van (which may be an RMS voltage) is within an allowable tolerance (i.e., within an allowable tolerance of the value of Van identified in the current service record). The allowable tolerance range may be a range within which a measured voltage would be deemed to satisfy a table entry (e.g., an entry at a particular column and row of a service record table).

As an illustration, an allowable tolerance range may be 5% and the measured voltage for Van may be 125 Volts. Using Table 1 as an example, if a measured voltage is within 5% of a ratio/value in the table, the measured voltage may be deemed to satisfy that table entry.

So, in this example, the allowable tolerance ranges for Van may be:

65.8 V<Van<72.76 V (Row 1 and Row 13)
114 V<Van<126 V (Row 2, Row 5, Row 8 and Row 14)
263.15 V<Van<290.85 V (Row 3 and Row 16)
57 V<Van<63 V (Row 4 and Row 7)228 V<Van<252 V (Row 6, Row 9 and Row 15)98.72 V<Van<109.11 V (Row 10)
197.44 V<Van<218.23 V (Row 11)
394.89 V<Van<436.46 V (Row 12)
456 V<Van<504 V (Row 17)

The measured value of Van, 125 Volts in this example, is within the allowable tolerance range of Van for the table entries for Van corresponding to Rows 2, 5, 8, and 14 of Table 1. That is, Van falls within the value 120 Volts, plus or minus the allowable tolerance range of this example, which is 5% (where 120 Volts may be identified by multiplying 120 Volts by 100% for records 2 and 14, and where 120 Volts may be identified by multiplying 240V by 50% for records 5 and 8). Thus, Van may be deemed to satisfy the value of Van in Rows 2, 5, 8, and 14 of Table 1.

In some embodiments, a similar tolerance may be used for other measured voltages as the tolerance used for Van. However, other embodiments may use a different tolerance range for other voltages.

If the measured voltage Van does not fall within the allowable tolerance range, the method may continue at 242. If the measured voltage Van is within the allowable tolerance range, at 246, a determination may be made whether the electrical energy meter is a 1-Element meter. If the meter is a 1-Element meter, the method may continue at 260.

If the electrical energy meter is not a 1-Element meter, the method may continue at 248, where a determination may be made whether voltage Vcn (which may be an RMS voltage) is within an allowable tolerance range. If the measured voltage Vcn does not fall within the allowable tolerance range, the method may continue at 242. If Vcn is within the allowable tolerance range, the method may continue at 250, where a determination may be made whether voltage Vca (which may be an RMS voltage) is within an allowable tolerance range. If the measured voltage Vca does not fall within the allowable tolerance range, the method may continue at 242. If the measured voltage Vca is within the allowable tolerance range, the method may continue at 252, where a determination may be made whether the electrical energy meter is a 2-Element meter. If the meter is a 2-Element meter, the method may continue at 260.

If the electrical energy meter is not a 2-Element meter, the method may continue at 254, where a determination may be made whether voltage Vbn (which may be an RMS voltage) is within an allowable tolerance range.

If the measured voltage Vbn does not fall within the allowable tolerance range, the method may continue at 242. If the measured voltage Vbn is within the allowable tolerance range, at 256, a determination may be made whether voltage Vab (which may be an RMS voltage) is within an allowable tolerance range. If the measured voltage Vab does not fall within the allowable tolerance range, the method may continue at 242. If the measured voltage Vab is within the allowable tolerance range, at 258, a determination may be made whether voltage Vbc (which may be an RMS voltage) is within an allowable tolerance range. If the measured voltage Vbc does not fall within the allowable tolerance range, the method may continue at 242. If the measured voltage Vbc is within the allowable tolerance range, in some embodiments, the method may continue at 280, where one or more components of the electric service may be identified. In other embodiments, the method may continue at 260, which may relate to phase rotation. At 260, phase rotation of a service type may be determined by using the exemplary method of FIG. 2C.

Figure 2C:
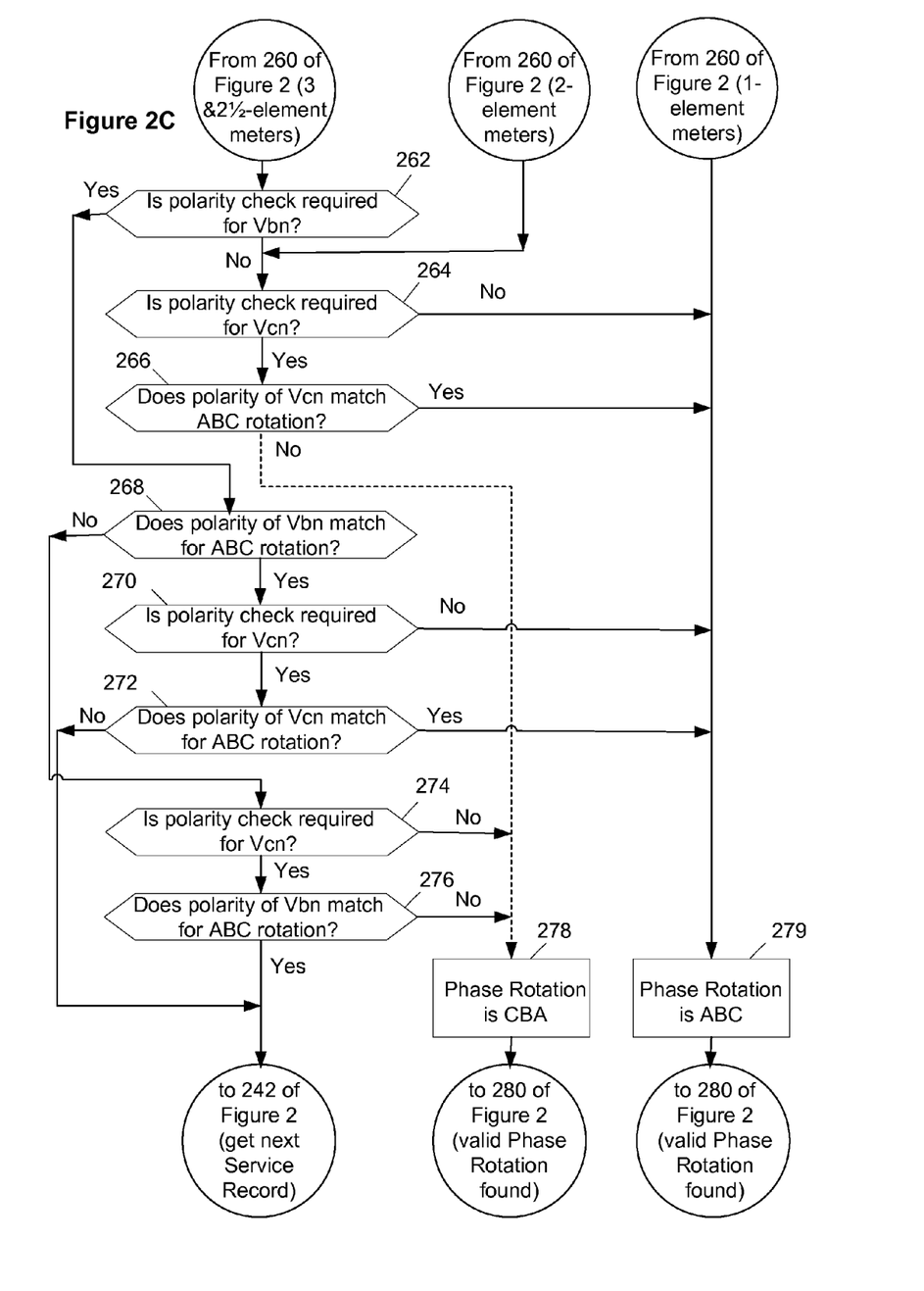
FIG. 2C illustrates an exemplary method to determine phase rotation of a particular service using voltage polarity values.

If the meter is a 1-element meter, the method from 260 of FIG. 2 may continue at 279 of FIG. 2C. Because there may be no phase rotation measurement involved in a 1-element meter, for consistency, the 1-element meter may be said to have ABC phase rotation. For a 2-element meter, the method from 260 of FIG. 2, may continue at 264 of FIG. 2C. For a 3-element or 2½-element meter, the method from 260 of FIG. 2 may continue at 262 of FIG. 2C.

FIG. 2C may determine whether polarities of the voltage signal(s) relate to an ABC rotation, CBA rotation, or, neither rotation, in which case the method may return to 242 of FIG. 2, e.g., to test the next record in the service record table.

A phase rotation may be identified by determining one or more polarities of one or more voltages. The one or more polarities of the one or more voltages may be compared to a service record in a service record table. As an example, a polarity may be determined for each of Vbn and Vcn and compared to the entries in Row 291 of FIG. 2A (e.g., the entries in columns 230 and 231). Detailed tables, such as Tables 1-4 may be used for such comparisons. The polarity values may be "pos" (for positive polarity), "neg" (for negative polarity) or "N/C" (indicating that a polarity check may not be required for the entry). Based on the polarity values, the phase rotation may be identified, e.g., as ABC phase rotation or CBA phase rotation. If the polarity values in columns 230 and 231 of FIG. 2A that are not "N/C," match actual values from the meter under test, the phase rotation may be determined to be ABC. If the polarity values in columns 230 and 231 of FIG. 2A that are not "N/C" do not match actual values from the meter under test, the phase rotation may be determined to be CBA. A determination of polarity may be needed for both voltages Vbn (column 230 of FIG. 2A) and Vcn (column 231 of FIG. 2A). Row 291 of FIG. 2A provides an example. In such a case, if one polarity matches and the other does not, then neither ABC nor CBA rotation is identified as the phase rotation, and the method may continue at 242 of FIG. 2.

Referring back to FIG. 2C at 262, for 3-element and 2½-element meter types, a determination may be made whether a polarity check of Vbn may be needed. As an example, referring to FIG. 2A, if a service record entry has a value of "N/C" associated with the polarity of Vbn (e.g., column 230 of row 292 in FIG. 2A), a polarity check of Vbn may not be required and the method may continue at 264, which is also the entry point for 2-element meter types. If a polarity check of Vbn is required, the method may continue at 268 to determine whether the polarity of Vbn matches the entry in the service record table. If the polarity does match, the method may continue at 270, and a determination may be made whether a polarity check of Vcn is required. If a polarity check of Vcn is not required, for example a service record table entry has a value of "N/C," the method may continue at 279, and the phase rotation may be identified as ABC. If a polarity check is required at 270, the method may continue at 272 to determine whether the polarity of Vcn matches the entry in the service record table. If the polarity does match, the method may continue at 279, where the phase rotation may be identified as ABC. If the polarity does not match at 272, the method may continue at 242 of FIG. 2, e.g., to test the next record in the service record table.

Referring back to FIG. 2C at 268, a determination may be made whether the polarity of Vbn matches the entry in the service record. If the polarity does not match, the method may continue at 274. At 274, a determination may be made whether a polarity check of Vcn is required. If a polarity check of Vcn is not required, the method may continue at 278, where the phase rotation is identified as CBA. Referring back to 274, if a polarity check of Vcn is required, the method may continue at 276, where a determination is made whether the polarity of Vcn matches the entry in the service record table. If the polarity does not match, the method may continue at 278, where the phase rotation may be identified as CBA. That is, the polarities for CBA rotation may be the opposite of the polarities given in the service record tables for ABC rotation. If the polarity does match in 276, the method may continue to 242 of FIG. 2, e.g., to test the next record in the service record table.

Referring back to FIG. 2C at 264, a determination may be made whether a polarity check of Vcn may be needed. If the corresponding column entry in the service record has a value of "N/C," then a determination of the polarity of Vcn is not required, and the method may continue at 279, where the phase rotation may be identified as ABC. In FIG. 2C, 279 may represent the entry point for 1-element meter types.

As described above, FIG. 2C has three entry paths that may originate from 260 of FIG. 2. The different entry paths may relate to different meter types as illustrated in FIG. 2C. FIG. 2C has three exit paths. One exit path may refer back to 242 of FIG. 2, and may be used if the polarities of Vbn and/or Vcn do not match the values for either an ABC rotation or a CBA rotation in the corresponding service record. The other two paths may be used if the polarities of Vbn and/or Vcn match the service record values for either an ABC rotation (e.g., at 279 of FIG. 2C) or a CBA rotation (e.g., at 278 of FIG. 2C).

The exit paths through 278 and 279 may continue at 280 of FIG. 2, which may indicate that a valid service has been determined and identify one or more components of the electric service, including phase rotation. To get to 280, the voltage values Van, Vbn, Vcn, Vab, Vbc and/or Vca may have been within the tolerance ranges around the nominally expected values for a given record in the service record table. A valid phase rotation may also have been determined (e.g., ABC at 279 of FIG. 2C or CBA at 278 of FIG. 2C) as specified in the last two columns of the service record table row. However, it may not be necessary to determine phase rotation in order to identify a valid service. That is, a valid service may be identified without using 260 of FIG. 2. Service information may be obtained from the service record (row) that satisfied the tests as described above (e.g., columns 221-223). Service information may include service type (e.g., column 221 of FIG. 2A), special service definition (e.g., column 222 of FIG. 2A), and nominal service voltage (e.g., column 223 of FIG. 2A).

Figure 3:
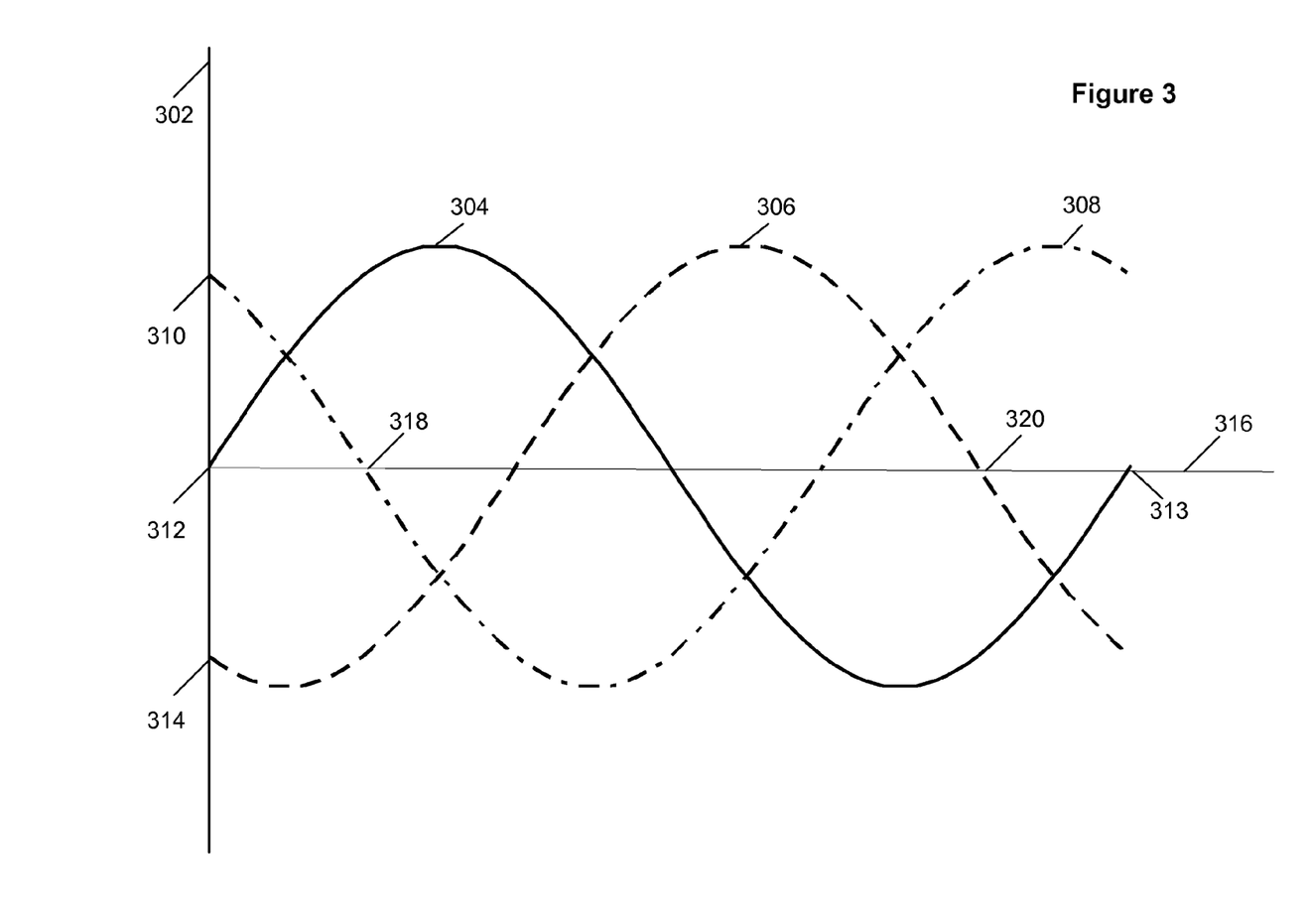
FIG. 3 is a diagram illustrating exemplary ideal voltages from a multi-phase electric service.

FIG. 3 is a diagram illustrating exemplary voltages from a "4WY" multi-phase electric service with ABC phase rotation (e.g., see row 291 of FIG. 2A). Vertical axis 302 may represent voltage values, and horizontal axis 316 may represent time. FIG. 3 includes voltage signal 304, voltage signal 306, and voltage signal 308. Voltage signal 304 may represent line to neutral voltage Van, voltage signal 306 may represent line to neutral voltage Vbn and voltage signal 308 may represent line to neutral voltage Vcn. Positive zero crossing 312 of voltage signal 304 (i.e., Van) is depicted. That is, zero crossing 312 of voltage signal 304 may be a point at which the value of voltage signal 304 is approximately zero volts and is crossing from a negative polarity to a positive polarity. Zero crossing 312 is arbitrarily used to define the start of a line cycle of voltage signal 304. Positive zero crossing 313 of voltage signal 304 (i.e., Van) is depicted. Zero crossing 313 of voltage signal 304 is the next positive zero crossing of voltage signal 304 following zero crossing 312 and serves to depict the end of the line cycle that started at zero crossing 312 and the beginning of a new line cycle. FIG. 3 illustrates voltage value 310 of voltage signal 308 at zero crossing 312 of voltage signal 304, and, voltage value 314 of voltage signal 306 at zero crossing 312 of voltage signal 304. For the example illustrated in FIG. 3, voltage value 310 of voltage signal 308 (i.e., Vcn) is illustrated as a positive voltage at zero crossing 312 of voltage signal 304. That is, when determining a polarity for Vcn, such as at 207 of FIG. 2B, voltage value 310 may be evaluated at zero crossing 312 resulting in a determination that Vcn has a positive polarity. Also for the example illustrated in FIG. 3, voltage value 314 of voltage signal 306 (i.e., Vbn) is illustrated as a negative voltage at zero crossing 312 of voltage signal 304. That is, when determining a polarity for Vbn, such as at 215 of FIG. 2B, voltage value 314 may be evaluated at zero crossing 312 resulting in a determination that Vbn has a negative polarity.

FIG. 2C illustrates an exemplary method for determining phase rotation. As an example, consider measurements from a 3-element meter for the voltages illustrated in FIG. 3, and, evaluating the measurements using the service record illustrated in row 291 of FIG. 2A. As described above, in FIG. 3 the polarity of Vbn is negative and the polarity of Vcn is positive.

The entry point in FIG. 2C may be 262. At 262 a determination is made whether a check of polarity is required for Vbn. Since column 230 of row 291 of FIG. 2A indicates a negative value, a check is required and the method may continue at 268 of FIG. 2C to check if the polarity of Vbn is negative. Since the polarity of Vbn is negative, the method may continue at 270 of FIG. 2C. At 270, a determination is made whether a check of polarity is required for Vcn. Since column 231 of row 291 of FIG. 2A indicates a positive value, a check is required and the method may continue at 272 of FIG. 2C to determine if the polarity of Vcn is positive. Since the polarity of Vcn is positive, the method may continue at 279, which indicates that the phase rotation is ABC.

Polarity measurements may be taken at times other than at the zero crossing. For example, FIG. 3 shows ideal voltage signals where the closest angular distance between the positive Phase A voltage zero crossing and the next closest zero-crossing is 60 degrees (e.g., 318 of voltage 308 with respect to zero crossing 312 of voltage 304 or 320 of voltage 306 with respect to zero crossing 313 of voltage 304). Additionally for a given service, with ideal voltage signals, the voltage zero-crossings that may be polarity tested may be at least 60 degrees away with respect to other voltage zero-crossings. That is, although the above example tested the value of voltages Vbn and Vcn at approximately the time of Van positive zero-crossing 312, testing of Vbn and Vcn values may be performed plus or minus 60 degrees around the Van positive zero crossing. This may be possible because a zero crossing may not occur over this interval, so, the measured values of Vbn and Vcn may be of same polarity over that interval.

A zero crossing, such as zero crossing 312 of FIG. 3 may predicted and/or detected. For example, a zero crossing may be predicted based on a previous zero crossing. As another example, samples may be taken and allocated based on a detected zero crossing.

Taking multiple measurements (e.g., sampling) for a period around the Van positive zero-crossing may provide one or more advantages. Sampling may allow taking voltage samples for each phase at different times, as may occur when using a single ADC multiplexed between the different phase voltages, which may reduce costs. Also having a period over which the polarity could be determined may allow one or more additional methods that may reduce possible errors due to noise on the actual voltage signals, for example, as illustrated in reference to FIG. 4.

Figure 4:
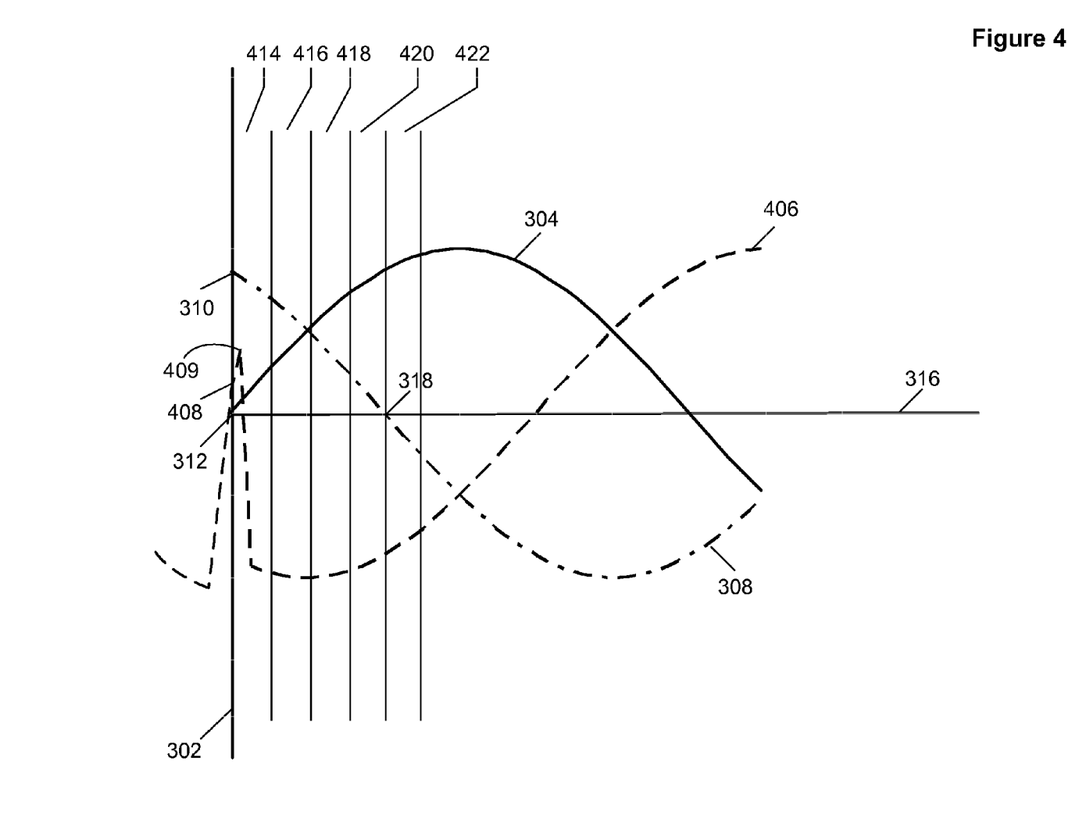
FIG. 4 is a diagram illustrating exemplary voltages with distortion from a multi-phase electric service, as well as sampling periods relating to the exemplary voltages.

FIG. 4 is a diagram illustrating exemplary voltages from a multi-phase electric service, as well as sampling periods relating to the exemplary voltages. FIG. 4 illustrates sample periods 414, 416, 418, 420, and 422. FIG. 4 includes components described in association with FIG. 3, including vertical axis 302, horizontal axis 316, voltage signal 304, voltage signal 308, zero crossing 312 of voltage signal 304, voltage value 310 of voltage signal 308, and zero crossing 318 of voltage signal 308 which occurs 60 electrical degrees after zero crossing 312 of signal 304. In FIG. 4, voltage signal 306 from FIG. 3 has been replaced with voltage signal 406, which is similar to voltage signal 306, but includes voltage spike 409 and a voltage value 408 at the zero crossing 312 of voltage signal 304. The method of using multiple measurements to determine a polarity may be used at 207 and 215 of FIG. 2B.

As an illustration, consider measurements from a 3-element meter for the voltages illustrated in FIG. 4, and, evaluating the measurements using the service record illustrated in row 291 of FIG. 2A. The example may be illustrated by making the evaluation first without the sampling technique and second with the sampling technique.

In the first example, since a 3-element meter is used, the polarities of Vbn and Vcn may be determined (e.g., steps 207 and 215 of FIG. 2B). For FIG. 4, similar to FIG. 3, the polarity of Vcn may be determined to be positive by using voltage value 310 of voltage signal 308 (Vcn) at approximately the time of positive Phase A zero crossing 312. The polarity of Vbn may also be determined to be positive in FIG. 4 since at zero crossing 312 voltage value 408 of voltage signal 406 is positive. That is, Vbn may be determined to have a positive polarity at zero crossing 312 in FIG. 4 and a negative polarity at zero crossing 312 in FIG. 3, even though the voltage signals in both FIGS. 3 and 4 may both be from a service with ABC rotation. It can be seen in FIG. 4 that the discrepancy is due to voltage spike 409 causing a deviation from the ideal voltage for Vbn. The effect of this discrepancy may be seen by reference to FIG. 2C.

As described above, the phase rotation for the service relating to the signals in FIG. 3 was determined to be ABC. In the current example, following the method of FIG. 2C, a valid phase rotation would not be identified for the service relating to the signals in FIG. 4. At 262 of FIG. 2C and using service record 291 of FIG. 2A, it may be determined that a polarity check of Vbn is required. At 268, it may be determined that the positive polarity of Vbn does not match service record 291 for an ABC rotation. Further, at 274 it may be determined that a polarity check is required for Vcn. At 276, it may be determined that the positive polarity of Vcn does match service record 291 for an ABC rotation, which results in the method continuing at 242. Thus, due to voltage spike 409, the ABC phase rotation was not identified.

In a second example, instead of taking a measurement of Vcn and Vbn at a zero crossing, multiple measurements may be taken. For example, FIG. 4 illustrates exemplary sample periods 414, 416, 418, 420 and 422. A measurement may be taken in each sample period. The sample periods may occur before the minimum theoretical time of 60 electrical degrees (the time between zero crossing 312 and zero crossing 318 of FIG. 4). Further, based on a given sampling rate, a theoretical maximum number of sample periods may be determined. As an illustration, an exemplary sample rate of 4000 samples per second may be assumed. 4000 metering samples per second divided by 60 cycles per second would equate to 66.66 samples per cycle or 5.4 degrees per sample period. Since the closest zero crossing of Vcn or Vbn may occur at approximately 60 degrees, the maximum number of sample periods may be calculated as 60 divided by 5.4, which results in a maximum number of 11 sample periods when using a sample rate of 4000 samples per second with a 60 hertz line frequency.

To determine the polarity of Vcn, multiple measurements may be taken of Vcn. For example, multiple sample periods may be defined, such as sample periods 414, 416, 418, 420 and 422 illustrated in FIG. 4. A measurement may be taken of Vcn during each of the multiple sample periods. However, set sample periods may not need to be established in order to take multiple measurements. A polarity of each of the measurements of Vcn may be determined. Continuing to use the exemplary voltages and sample periods of FIG. 4, the polarities of the individual samples of voltage signal 308 (Vcn) may be determined to be:

Measurement from sample period 414—polarity is positive

Measurement from sample period 416—polarity is positive

Measurement from sample period 418—polarity is positive

Measurement from sample period 420—polarity is positive; and

Measurement from sample period 422—polarity is positive

A determination of the polarity of Vcn may be made. The determination may be made by determining a majority of the polarities determined for each of the measurements. Using the above example, each measurement has a positive polarity. Because the majority of the measurements indicate a positive polarity (i.e., the number of positive measurements is greater than the number of negative measurements), the polarity of Vcn may be determined to be positive. Other methods of determining the polarity of a voltage signal known in the art may be used. For example, polarity may be determined by the evaluation of the sign of the summation of the individual reading magnitudes. Further, the weighted values for each of the multiple polarity readings may be used.

To determine the polarity of Vbn, multiple measurements may be taken of Vbn. For example, multiple sample periods may be defined, such as the sample periods illustrated in FIG. 4, and a measurement may be taken of Vbn during each of the multiple sample periods. A polarity of each of the measurements of Vbn may be determined. Continuing to use the exemplary voltages and sample periods of FIG. 4, the polarities of the individual samples of voltage signal 406 may be determined to be:

Measurement from sample period 414—polarity is positive

Measurement from sample period 416—polarity is negative

Measurement from sample period 418—polarity is negative

Measurement from sample period 420—polarity is negative; and

Measurement from sample period 422—polarity is negative

A determination of the polarity of Vbn may be made. The determination may be made by determining a majority of the polarities determined for each of the measurements. Because the majority of the measurements indicate a negative polarity (i.e., the number of negative polarity measurements, 4, is greater than the number of positive polarity measurements, 1), the polarity of Vbn may be determined to be negative. As opposed to using the single measurement described above, the use of multiple measurements results in the correct determination of Vbn even with the voltage spike present in the signal.

In the current example, Vbn has been determined to have a negative polarity and Vcn has been determined to have a positive polarity. Referring back to FIG. 2C, and continuing to use the example of service record 291, the phase rotation may be identified as an ABC. The analysis is similar to that used for the voltage signals of FIG. 3, since the determined polarities and service record in this example are those used in the example relating to FIG. 3.

It should also be appreciated that the decision to use Van as the reference voltage signal to identify a zero crossing is arbitrary. Another voltage signal may be chosen to identify a zero crossing, with polarity measurements being taken of the other voltage signal(s). The values in the service record tables 1, 2, 3, 4 and FIG. 2A, however, may need to be modified, e.g., to correctly identify the line to neutral voltages, line to line voltages and voltage polarity columns.

What is claimed:

1. A method relating to an energy meter, comprising:
   measuring a line to neutral voltage;
   measuring a line to line voltage; and
   determining a service type relating to a connection of the energy meter based on the line to neutral voltage and the line to line voltage.

2. The method of claim 1, further comprising determining a nominal service voltage relating to the connection of the energy meter based on the line to neutral voltage and the line to line voltage.

3. The method of claim 1, wherein the line to neutral voltage and the line to line voltage are root-mean-square values.

4. The method of claim 2, wherein determining the service type and the nominal service voltage further comprises storing reference information relating to at least one service type and nominal service voltage.

5. The method of claim 4, wherein determining the service type and the nominal service voltage further comprises comparing the line to neutral voltage and the line to line voltage to the reference information.

6. The method of claim 1, further comprising:
   detecting a zero crossing of a first line to neutral voltage;
   determining a polarity of a second line to neutral voltage; and
   determining a phase rotation relating to the connection of the energy meter based on the zero crossing of the first line to neutral voltage and the polarity of the second line to neutral voltage.

7. The method of claim 6, wherein determining the polarity of the second line to neutral voltage further comprises taking samples of the second line to neutral voltage.

8. The method of claim 7, wherein determining the polarity of the second line to neutral voltage further comprises determining a majority relating to the samples.

9. The method of claim 6, further comprising identifying a valid service, wherein the valid service comprises the service type, the nominal service voltage and the phase rotation.

10. An electrical energy meter comprising:
    a digital signal processor, the digital signal processor measuring a line to neutral voltage and measuring a line to line voltage; and
    a microcontroller, the microcontroller receiving the line to neutral voltage and the line to line voltage and determining a service type relating to a connection of the electrical energy meter based on the line to neutral voltage and the line to line voltage.

11. The electrical energy meter of claim 10, wherein the microcontroller further determines a nominal service voltage relating to the connection of the electrical energy meter based on the line to neutral voltage and the line to line voltage.

12. The electrical energy meter of claim 10, wherein the line to neutral voltage and the line to line voltage are root-mean-square values.

13. The electrical energy meter of claim 11, further comprising a memory configured to store reference information relating to at least one service type and nominal service voltage.

14. The electrical energy meter of claim 13, wherein, to determine the service type and the nominal service voltage, the microcontroller is further configured to compare the line to neutral voltage and the line to line voltage to the reference information.

15. The electrical energy meter of claim 10, wherein:
    the digital signal processor further:
    detects a zero crossing of a first line to neutral voltage;
    determines a polarity of a second line to neutral voltage; and
    the microcontroller further:
    determines a phase rotation relating to the connection of the electrical energy meter based on the zero crossing of the first line to neutral voltage and the polarity of the second line to neutral voltage.

16. The electrical energy meter of claim 15, wherein the digital signal processor is further configured to take samples of the second line to neutral voltage.

17. The electrical energy meter of claim 16, wherein the microcontroller is further configured to determine a majority relating to the samples.

18. The electrical energy meter of claim 15, wherein the microcontroller is further configured to identify a valid service, wherein the valid service comprises the service type, the nominal service voltage and the phase rotation.

19. A method relating to an energy meter, comprising:
    detecting a zero crossing of a first line to neutral voltage;
    determining a polarity of a second line to neutral voltage; and determining a phase rotation relating to a connection of the energy meter based on the zero crossing of the first line to neutral voltage and the polarity of the second line to neutral voltage.

20. The method of claim 19, wherein determining the polarity of the second line to neutral voltage further comprises taking samples of the second line to neutral voltage.

21. The method of claim 20, wherein determining the polarity of the second line to neutral voltage further comprises determining a majority relating to the samples.

22. The method of claim 19, further comprising:
measuring a line to neutral voltage;
measuring a line to line voltage; and
determining a service type relating to the connection of the energy meter based on the line to neutral voltage and the line to line voltage.

23. The method of claim 22, further comprising determining a nominal service voltage relating to the connection of the energy meter based on the line to neutral voltage and the line to line voltage.

24. The method of claim 22, wherein the line to neutral voltage and the line to line voltage are root-mean-square values.

25. The method of claim 23, wherein determining the service type and the nominal service voltage further comprises storing reference information relating to at least one service type and nominal service voltage.

26. The method of claim 25, wherein determining the service type and the nominal service voltage further comprises comparing the line to neutral voltage and the line to line voltage to the reference information.

27. The method of claim 22, further comprising identifying a valid service, wherein the valid service comprises the service type, the nominal service voltage and the phase rotation.

28. An electrical energy meter comprising:
a digital signal processor, the digital signal processor detecting a zero crossing of a first line to neutral voltage and determining a polarity of a second line to neutral voltage; and
a microcontroller, the microcontroller determining a phase rotation relating to a connection of the electrical energy meter based on the zero crossing of the first line to neutral voltage and the polarity of the second line to neutral voltage.

29. The electrical energy meter of claim 28, wherein the digital signal processor further takes samples of the second line to neutral voltage.

30. The electrical energy meter of claim 29, wherein the microcontroller further determines a majority relating to the samples.

31. The electrical energy meter of claim 28, wherein:
the digital signal processor further:
measures a line to neutral voltage;
measures a line to line voltage; and
the microcontroller further:
determines a service type relating to the connection of the electrical energy meter based on the line to neutral voltage and the line to line voltage.

32. The electrical energy meter of claim 31, wherein the microcontroller further determines a nominal service voltage relating to the connection of the electrical energy meter based on the line to neutral voltage and the line to line voltage.

33. The electrical energy meter of claim 31, wherein the line to neutral voltage and the line to line voltage are root-mean-square values.

34. The electrical energy meter of claim 32, further comprising a memory configured to store reference information relating to at least one service type and nominal service voltage.

35. The electrical energy meter of claim 34, wherein, to determine the service type and the nominal service voltage, the microcontroller is further configured to compare the line to neutral voltage and the line to line voltage to the reference information.

36. The electrical energy meter of claim 31, wherein the microcontroller is further configured to identify a valid service, wherein the valid service comprises the service type, the nominal service voltage and the phase rotation.

* * * * *